March 15, 1960 C. R. WILHELMSEN 2,929,025

TRANSISTOR SIGNAL-TRANSLATING SYSTEM

Filed Jan. 22, 1957 2 Sheets-Sheet 1

TRANSISTOR SIGNAL-TRANSLATING SYSTEM

Filed Jan. 22, 1957 2 Sheets-Sheet 2

United States Patent Office 2,929,025

Patented Mar. 15, 1960

2,929,025

TRANSISTOR SIGNAL-TRANSLATING SYSTEM

Carl R. Wilhelmsen, Huntington Station, N.Y., assignor to Hazeltine Research, Inc., Chicago, Ill., a corporation of Illinois Application January 22, 1957, Serial No. 635,329

7 Claims. (Cl. 330—18)

*General*

The present invention is directed to transistor signal-translating systems and, more particularly, to transistor amplifier systems which afford stabilization against variations in temperature and supply voltage that would undesirably shift the operating point of the transistors therein.

The stabilization problem in the transistor signal-translating stages of radio apparatus such as radio receivers is an important one. Heretofore it has been approached on the basis of the stabilization of individual stages of a transistor radio receiver and, to a more limited extent, on the basis of cascade-connected stages. Various biasing techniques including the use of negative feedback resistors have been employed with success but have suffered from the drawback of needing a greater number of circuit components, such as resistors and condensers, than is desired. The manufacture of radio receivers is highly competitive and the saving of a few components in a production model radio receiver represents a large over-all saving when the total production quantity is considered. Transistorized radio receivers have a potentially large market which will be greatly stimulated as the price of such receivers decreases.

It is an object of the present invention, therefore, to provide a new and improved stabilized signal-translating system which is economical of circuit components.

It is another object of the invention to provide a new and improved signal-translating system which employs a pair of stabilized transistor stages.

It is a further object of the invention to provide a new and improved cascade-connected transistor amplifier system which is stabilized by circuit means employing a relatively small number of circuit components.

In accordance with a particular form of the invention, a transistor signal-translating system operable over a given temperature range comprises a multiple-unit transistor device effectively including two junction transistors each having an emitter, a base, and a collector and wherein the collector of the first transistor and the emitter of the second transistor share a common semi-conductive zone of the device. The system also comprises a first signal-translating circuit including the first transistor, first signal input means connected between the base and emitter of the first transistor for receiving a first signal, and first signal output means connected between the collector and emitter thereof to which the first signal is translated. A second signal-translating circuit is also provided including the second transistor, second signal input means connected to the base thereof for receiving a second signal relative to a point of ground reference potential and for maintaining the direct potential of the base substantially at that reference potential, and second signal output means connected between the collector and the emitter of the second transistor to which the second signal is translated. The signal-translating system additionally comprises biasing means including means connected to the base of the first transistor for applying a direct bias potential thereto relative to the above-mentioned point of reference potential. Means including a resistive impedance is connected to the emitter of the first transistor to establish a series direct-current path including the resistive impedance and the emitter and collector of each transistor, while a capacitive impedance is connected to the common zone of the transistor device to maintain the signal potential thereof at ground reference potential. Finally, the system includes means for supplying direct potentials relative to the foregoing point of reference potential respectively to the resistive impedance and to the collector of the second transistor to establish a direct current through the foregoing series path. In this way, the resistive impedance serves to stabilize each of the two signal-translating circuits against the effects of temperature variations within the given temperature range and variations in the various direct potentials.

For a better understanding of the present invention, together with other and further objects thereof, reference is had to the following description taken in connection with the accompanying drawings, and its scope will be pointed out in the appended claims.

Referring to the drawings.

Figure 1:
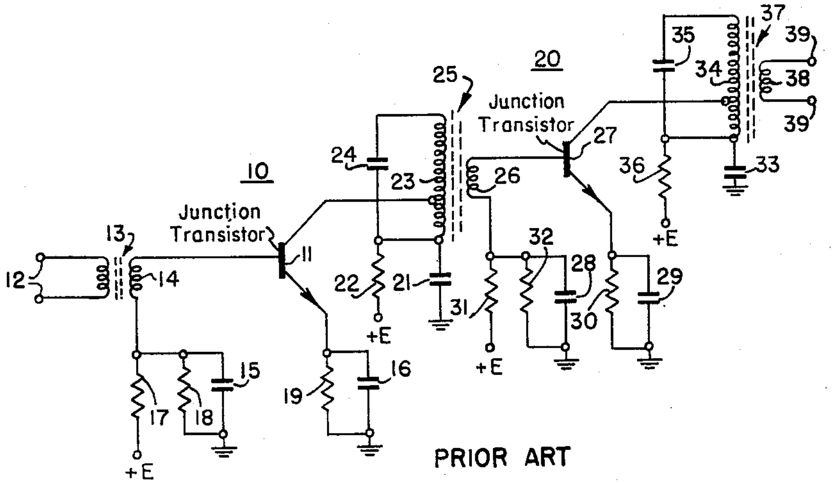
Fig. 1 is a circuit diagram of a cascade-connected transistor signal-translating or intermediate-frequency amplifier system in accordance with the prior art.

*Description of signal-translating system of Fig. 1*

Referring now to Fig. 1 of the drawings, there is represented a signal-translating system in accordance with the prior art which is useful as a cascade-connected intermediate-frequency amplifier system. This system includes a first signal-translating circuit or amplifier stage 10, including a first junction transistor 11, which for convenience is represented as one of the NPN type having usual emitter, base, and collector electrodes, signal input means coupled between the base and emitter electrodes, and signal output means coupled between the collector and emitter electrodes. The signal input means includes a transformer 13 having a pair of input terminals 12, 12 connected to the primary winding thereof, while its secondary winding 14 has one terminal connected to the base electrode of the transistor 11 and its other terminal connected to ground through an intermediate-frequency by-pass condenser 15. The input circuit is completed by way of intermediate-frequency by-pass condenser 16 connected between the emitter electrode and ground, thus effectively grounding the emitter with respect to signal translation. A resistor 19 is connected in parallel with the condenser 16 while a resistor 18 is similarly connected across the condenser 15 and to a resistor 17 forming with the resistor 18 a series circuit between a source of biasing potential +E and ground. The signal output means includes a connection between the collector electrode of transistor 11 and a tap on a winding 23, one terminal of which is connected to ground through an intermediate-frequency by-pass condenser 21 which, with the condenser 16 completes that output means. Accordingly, the emitter electrode is common to both the input and output circuits of transistor 11. A condenser 24 which is connected in parallel with the winding 23 tunes at other desired intermediate frequencies. A source of potential +E is connected through a resistor 22 to the junction of the condenser 21 and the winding 23 and supplies a suitable operating potential to the collector electrode of the transistor 11.

The intermediate-frequency amplifier system of Fig. 1 also includes a second signal-translating circuit 20 including a second junction transistor 27, which is represented as being of the same conductivity type as transistor 11 and having the usual electrodes, signal input means coupled between the base and emitter electrodes of transistor 27 and signal output means coupled between the collector and emitter electrodes thereof. Winding 23 is the primary winding of an interstage transformer 25 which has a secondary winding 26 that includes one terminal that is connected to the base electrode of transistor 27 and another terminal which is connected to ground for signal frequencies by means of an intermediate-frequency by-pass condenser 28. The signal input means is completed by means of an intermediate-frequency by-pass condenser 29 connected between the emitter electrode and ground, thus grounding the emitter with respect to signal translation. Biasing potentials for the input circuit means are supplied by a source +E which is connected to ground through a voltage divider comprising series-connected resistors 31 and 32, the latter being connected in parallel with the condenser 28. A resistor 30 is also connected in parallel with the condenser 29. The signal output means includes a connection between the collector electrode of transistor 27 and a tap on a winding 34, one terminal of the latter being connected to ground through an intermediate-frequency by-pass condenser 33. In this way the signal output means is connected between the collector and emitter so that the emitter is common to both the input and output circuits of transistor 27. The winding 34 is resonated at the desired intermediate frequency by a condenser 35 connected in parallel therewith. Operating potential for the collector circuit is supplied by a source +E which is connected through a resistor 36 to the junction of the condenser 33 and the winding 34. Winding 34 constitutes the primary winding of an output transformer 37 having a secondary winding 38 which includes output terminals 39, 39 for connection to a suitable utilizing circuit (not shown).

The parameters of the amplifier system just described including the transistors 11 and 27 and several sources +E, together with the resistors 17, 18, 19, 22, 31, 32, 30, and 36 providing the bias and operating potentials for the transistors, are selected to produce the desired stabilization of the system. It will be helpful in understanding the general manner in which this is accomplished by means of the following explanation taken in conjunction with Figs. 2–5, inclusive, which apply to a representative amplifier circuit such as stage 10.

Figure 2:
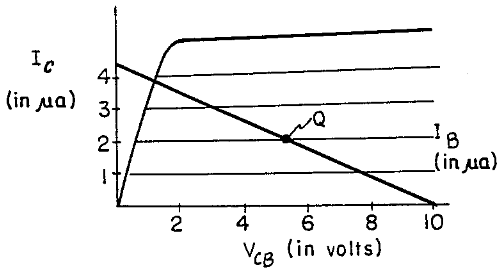
Fig. 2 is a set of characteristic curves for a junction transistor.
Figure 3:
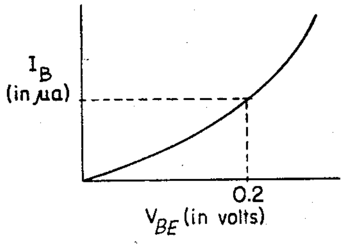
Fig. 3 is another characteristic curve for a junction transistor.

A typical set of characteristics for a junction transistor are as represented in Fig. 2, where the ordinate represents collector current $I_C$ in milliamperes and the abscissa represents the voltage $V_{CB}$ between the collector and the base, and $I_B$ denotes the base current in microamperes. For simplicity of representation, this graph has been somewhat idealized. It will be noted from the figure that, within the current range of the transistor, the collector current $I_C$ is nearly a linear function of the base current $I_B$ for a given collector-to-base voltage $V_{CB}$. It is therefore convenient, knowing the desired voltage $V_{CB}$, to pick a line and thus an operating point such as point Q for satisfactory operation. This then establishes the collector current $I_C$ and also the base current $I_B$. Thus, by supplying the required collector-to-base voltage $V_{CB}$ and base current $I_B$, all other operating conditions will automatically assume the necessary corresponding values. The input characteristics of a typical junction transistor are as represented in Fig. 3. Therefore, in order to secure the required base current $I_B$, the corresponding base-to-emitter voltage $V_{BE}$ need only be established.

Figure 4:
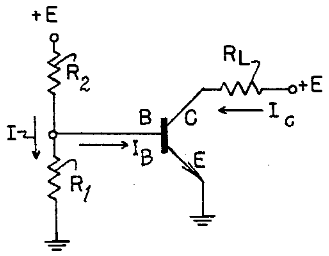
Fig. 4 is a direct-current equivalent circuit for a typical grounded emitter—common emitter transistor amplifier employing an NPN junction transistor.

For a typical fixed base bias voltage common grounded emitter stage as represented in Fig. 4, the base-to-emitter voltage (say 0.1 to 0.3 volt) $V_{BE}$ is small compared with the collector-to-base voltage $V_{CB}$ (say 1 to 10 volts), so that the collector-to-base voltage $V_{CB}$ is substantially equal to the collector-to-emitter voltage $V_{CE}$. Consequently, the desired values of $V_{CB}$ and $V_{CE}$ can be established by using a battery to supply a potential E above ground to the collector, knowing that:

$$E=V_{CE}+I_C R_L \quad (1)$$

where $I_C$ is the collector current flowing through a load resistor $R_L$. Since the values of $R_L$ and $I_C$ are fixed by the chosen operating point Q in Fig. 2, the required battery potential E is determined.

The required base-to-emitter voltage $V_{BE}$ can be provided by connecting the same battery across a voltage divider comprising resistors $R_2$ and $R_1$ in series, the junction of those resistors being connected to the base of said transistor. So long as the current I thus established through those resistors is much greater than the base current $I_B$, then:

$$V_{BE}=V_{BG}=\frac{R_1}{R_1+R_2}E \quad (2)$$

where $V_{BG}$ is the voltage between the base electrode and ground. Thus the values of the resistors $R_1$ and $R_2$ can be selected.

There exists the well-known tendency for the collector current $I_C$ of a transistor to change with a change in temperature or because of variations which exist in individual transistors as when one transistor is substituted for another in the circuit under consideration. This will cause the operating point Q to shift to some new point which may then cause unsatisfactory operation of the amplifier.

Figure 5:
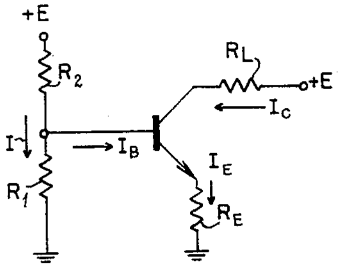
Fig. 5 is the direct-current equivalent circuit for a typical common emitter NPN junction transistor amplifier having stabilization.

If the typical circuit of Fig. 5, which is rather widely used to effect stabilization, is considered, much of the above type of circuit analysis applies. In the Fig. 5 circuit:

$$V_{CE}=E-I_C R_L-I_E R_E \quad (3)$$

where $R_E$ is an additional impedance connected in series between the transistor emitter and ground. Now if the current gain factor $\alpha_{CB}$ is sufficiently large, as is the usual case, then the collector current $I_C$ is substantially equal to the emitter current $I_E$. Therefore:

$$V_{CE}=E-I_C(R_L+R_E) \quad (4)$$

The parameters $V_{CE}$, $I_C$, and $R_L$ are selected to establish a satisfactory operating point, and are provided in the manner described above in connection with Fig. 4. From considerations set forth below, $R_E$ can be picked and thus the required E may be selected. Knowing that:

$$V_{EG}=I_E R_E$$

and $$V_{BE}=V_{BG}-V_{EG} \quad (5)$$

it follows that:

$$V_{BG}=V_{BE}+I_E R_E \quad (6)$$

The values $I_E$ and $V_{BE}$ are set by the chosen operating point as described above with reference to Fig. 4, so that the corresponding required value of $V_{BG}$ is determined. This value may be derived from the battery potential E applied to a voltage divider comprising resistors $R_1$ and $R_2$ in series and having magnitudes chosen to satisfy the relation $$V_{BG}=\frac{R_1}{R_1+R_2}E \qquad (7)$$

as before, assuming that the current I through the resistors $R_2$ and $R_1$ is much greater than the base current $I_B$. When the two currents have the relation just mentioned, it will be noted in the circuit of Fig. 5 that:

$$V_{BE}=V_{BG}-V_{EG}=V_{BG}-I_E R_E \qquad (8)$$

The second term of the last equation indicates that current degeneration exists in the circuit of Fig. 5 and that any tendency for the collector current $I_C$ to change, thereby substantially equally changing the emitter current $I_E$, will result in a change in the base-to-emitter voltage $V_{BE}$ of such polarity as to minimize the change in the collector current $I_C$. Thus the operating point of the transistor will tend to remain substantially constant despite changes in temperature or variations in individual transistors should one be substituted in the circuit for another. This is both desirable and necessary in the performance of a transistor circuit of the type under consideration. It will be noted that larger values of the resistor $R_E$ afford more feedback and hence greater stabilization. The size of the resistor, however, must be consistent with the desired voltage $V_{CE}$ between the collector and the emitter when the values of the resistor $R_L$ and E are specified. Additionally, it is important that the voltage $V_{BG}$ between the base electrode and ground remain constant despite variations in the base current $I_B$. Thus the current I in the resistors $R_1$ and $R_2$ should be much greater than the base current $I_B$ and this necessitates sufficiently low resistance values for the resistors $R_1$ and $R_2$ while at the same time having the correct ratio to satisfy the conditions of the Equation 2 above.

By employing the principles utilized above, the parameters of each signal-translating stage or amplifier of Fig. 1 may be selected to assure the desired stabilization. In addition to the selected transistors 11 and 27, these parameters involve sources of operating and bias potentials, the resistors 17, 18, 19, 22, 31, 32, 30, and 36, and the condensers 15, 16, 21, 28, 29, and 33 for assuring the necessary low impedance connections in portions of the emitter base, and collector circuits for the translated signals which ordinarily are alternating-current signals. Thus it will be seen that the amplifier system of Fig. 1, which is stabilized in a conventional manner, requires the use of eight resistors and six condensers.

Figure 6:
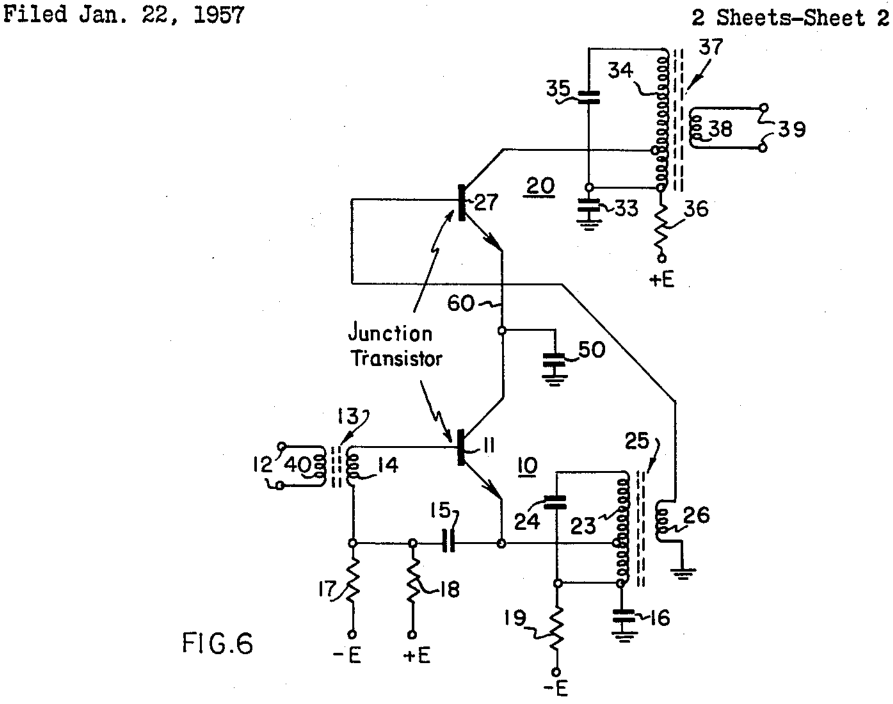
Fig. 6 is a circuit diagram of a transistor signal-translating system in accordance with a particular embodiment of the present invention.
Figure 7:
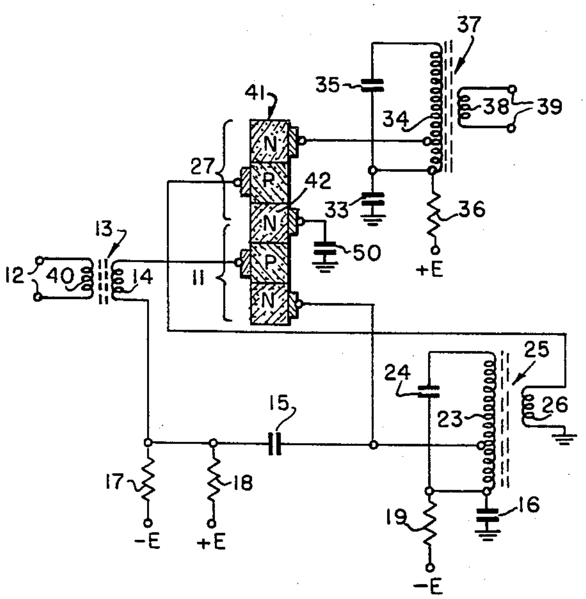
Fig. 7 is a modified form of the signal-translating system of Fig. 6.

*Description of signal-translating system of Figs. 6 and 7*

Referring now more particularly to Fig. 6 of the drawings, there is represented a transistor signal-translating system in accordance with a particular embodiment of the invention which is operable over a given temperature range. While a system of the type under consideration may be employed to translate signals of widely different frequency ranges as by providing a separate input signal source for the second transistor signal-translating circuit thereof, since both transistor circuits are so connected that each may operate without affecting the other with respect to signals translated thereby, for convenience the system under consideration is represented as a tandem-connected intermediate-frequency amplifier system. This system bears some resemblance to that of Fig. 1 and corresponding circuit elements appearing in the two figures have been identified with the same reference numerals. The Fig. 6 system includes a first signal-translating circuit 10 including a first junction transistor 11 having the usual three electrodes, signal input means coupled between the base electrode and one of the emitter and collector electrodes and, in particular, between the base and emitter electrodes, and signal output means coupled between the collector electrode and one of the emitter and base electrodes, and more particularly, between the collector and emitter electrodes. The transistor 11 is connected in the common emitter relation and, to that end, the secondary winding 14 of the transformer 13 has one terminal connected to the base electrode and its other terminal connected through the coupling condenser 15 to the emitter electrode. In spite of the fact that it is the emitter which is common so that the prior art teaches that it must be the grounded electrode, in accordance with the invention the collector is established as the grounded electrode for translated signals by way of grounded by-pass condenser 50. The output circuit between the collector and emitter is completed by connecting the emitter to a tap on the winding 23 of the interstage transformer 25, one terminal of that winding being connected to ground for signal frequencies by the condenser 16.

The second signal-translating circuit 20 of the system includes a second junction transistor 27, of the same conductivity type as transistor 11, also having the usual three electrodes. Signal input means are coupled between the base electrode and one of the emitter and collector electrodes of the second transistor 27 and, in particular between the base and emitter electrodes thereof, and signal output means are coupled between the collector electrode and one of the emitter and base electrodes of transistor 27. More particularly, this signal output means is coupled between the collector and emitter electrodes of transistor 27. The signal input means includes the emitter electrode which is connected to ground through the condenser 50 and the circuit between the base electrode and ground which includes the secondary winding 26 of interstage transformer 25. It will be seen, therefore, that the base electrode of transistor 27 is effectively maintained at ground potential for unidirectional currents. In addition to including the grounded emitter of transistor 27, the signal output means of circuit 20 includes the collector which is connected to ground through a portion of the winding 34 and through the condenser 33. A direct-current connection 60 exists between the emitter of transistor 27 and the collector of transistor 11.

The transistor signal-translating or amplifier system of Fig. 6 also includes means for supplying operating potentials to the transistors comprising biasing means for the base electrodes thereof and a series direct-current energizing path that includes the collector and emitter electrodes of both transistors and a direct-current connection which is between one of the collector and emitter electrodes of transistor 11 and one of the collector and emitter electrodes of the second transistor 27 and which is maintained at a fixed potential for signals that are translated by the circuits 10 and 20, whereby this system is stabilized against the effects of temperature variations in the operating temperature range of the system and poential variations of the supply means. More particularly, the direct-current connection just mentioned is the connection 60 between the emitter of transisor 27 and the collector of transistor 11. The biasing means for the base electrode of transistor 11 includes a potential supply means represented in the drawings as +E, −E, the terminals of this source being interconnected by means of series-connected resistors 18 and 17, the junction of which resistors is connected to the junction of the winding 14 and the condenser 15. This biasing means also includes the winding 26 which is effective to maintain the base of transistor 27 at ground potential, and so at the potential of the battery tap, for unidirectional currents as previously mentioned. The series direct-current energizing path mentioned above includes the supply source designated +E, −E, the center terminal of which is grounded, the resistor 36 connected to the positive terminal of the source, a portion of the winding 34 which is connected to the collector of transistor 27, the collector and emitter of transistor 27, the direct-current connection 60 between the emitter of transistor 27 and the collector of transistor 11, the collector and emitter of transistor 11, and the connections between the emitter of transistor 11 and the negative terminal −E of the supply source including a portion of the winding 23 and the resistor 19.

The signal-translating or amplifier system of Fig. 7 is substantially identical with that of Fig. 6 and differs therefrom only in the junction transistors employed therein. The circuit diagram of Fig. 6 indicates that the transistors may be two junction transistors of the conventional type. In Fig. 7, however, transistors 11 and 27 comprise portions of a multiple-unit transistor device 41 having an intermediate zone 42 which is common to both transistors and serves both as the collector of transistor 11 and the emitter of transistor 27. Device 41 has five zones of alternating opposite conductivity types which may be of the PNPNP or of the NPNPN conductivity types in the embodiment represented, the last-mentioned type of semiconductive materials being represented however. Such a multiple-unit transistor device is desirable since it effectively includes two transistors which may be secured at a cost approximately 70% of that of two individual transistors of the conventional sort. It will be appreciated that the transistor device 41 effectively includes a built-in direct-current connection between the emitter of transistor 27 and the collector of transistor 11 since zone 42 is common to those electrodes. Accordingly, fewer electrical connections need be made with the circuit of Fig. 7 in relation to those required on the circuit of Fig. 6. The designs of the signal-translating systems of Figs. 6 and 7 are substantially identical so that a consideration of one will also apply to the other.

Figure 8:
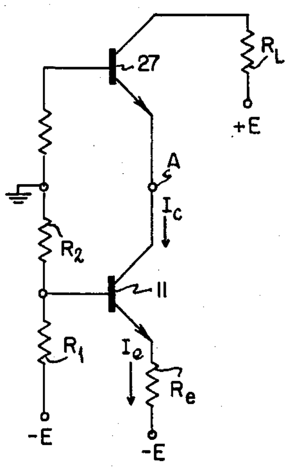
Fig. 8 is a direct-current equivalent circuit thereof useful in explaining the stabilization in the circuits of Figs. 6 and 7.

The selection of the parameters of the signal-translating system of Fig. 6 to afford the desired stabilization with a small number of selected components but without impairing its operation will be explained by first referring to the bottom half of its direct-current equivalent circuit of Fig. 8. It will be noted that the bottom half of the circuit, which is associated with the transistor 11, is essentially the circuit of Fig. 5. It will be observed that the emitter and base circuits of the transistor of Fig. 5 and the transistor 11 of Fig. 8 are the same and, by a suitable voltage applied at point A of Fig. 8 (in a manner to be explained below), the operation of the circuit for transistor 11 will be the same as the circuit of Fig. 5. It will be seen from Fig. 2 that the collector current $I_C$ of the transistor is reasonably independent of the voltage $V_{CB}$ between the collector and base electrodes. Again the collector current will be almost entirely a function of the base current, and therefore of the base electrode bias over the useful operating range of variations of the voltage between point A and ground.

Considering next the upper transistor 27 of Fig. 8, only a small voltage $V_{BE}$ exists between the base and the emitter. Thus the voltage between the base and ground will determine the voltage between point A and ground. This is the method by which the desired collector voltage of the bottom transistor 11 will be determined.

For reasons previously mentioned in the paragraph describing Fig. 5, the collector-to-emitter voltage of the upper transistor 27 does not affect the collector current $I_C$ over a useful operating range. Since the transistors 27 and 11 are connected in series with reference to the direct-current energizing path (which path includes the terminal +E of the energizing source, the resistor $R_L$, the three zones of the transistor 27, the direct-current connection between the emitter of that transistor and the collector of transistor 11, the three zones of the transistor just mentioned, and the resistor $R_E$ connected between the emitter of transistor 11 and the negative terminal −E of the source), the collector current established in the bottom transistor 11 will also constitute the collector current of the other transistor 27 and the voltage between the base and the emitter of the top transistor 27 will automatically set itself to supply the base current required to support that value of collector current. The collector current of the top transistor, therefore, will have the same stabilization as that of the collector current of the bottom transistor 11. Thus the current and the stabilization thereof for both transistor circuits are established by the biasing elements of the bottom transistor. The voltage $V_{CE}$ between the collector and emitter of the bottom transistor 11 is established by the applied voltage between the base of transistor 27 and ground which is substantially equal to the voltage at point A, and the product of the emitter current times the emitter resistance of transistor 11. The latter quantity is substantially equal to the product $I_C R_E$ of the collector current times the emitter resistance. Knowing the voltage at point A, the potential of the source E is set to provide the top transistor 27 with the desired voltage between its collector and emitter which in turn is equal to the voltage of the source E minus that of the voltage at point A.

By employing the design procedure set forth above, the pertinent parameters of the transistors of Figs. 6 and 7 may be selected so that the signal-translating system is adequately stabilized against the effects of temperature variations and potential variations of the supply means. To effect this stabilization, fewer components are required in the circuits of Figs. 6 and 7 as compared with the prior art circuit of Fig. 1. Four resistors, namely resistors 17, 18, 19 and 36, and four condensers 15, 16, 50, and 33 are required in the circuits of Figs. 6 and 7 as compared with eight resistors and six condensers utilized in the system of Fig. 1. This represents a substantial saving when viewed from a standpoint of the manufacture of many such systems. In addition, when the circuit of Fig. 7 is employed, the additional substantial saving of a multiple-unit transistor over two separate transistors is achieved.

The operation of the signal-translating system of each of Figs. 6 and 7 is straightforward and will be referred to very briefly. An intermediate-frequency input signal applied to the input terminals 12, 12 is supplied between the base and emitter electrodes of transistor 11 and an amplified replica thereof appears between the collector and emitter electrodes for application to the tuned winding 23 of the interstage transformer 25. The secondary winding of the latter supplies this output signal between the base and emitter electrodes of transistor 27 and the latter further serves to amplify that signal and develop in its collector circuit connected to the tuned winding 34 of transformer 37 a suitably amplified output signal for translation by the secondary winding 38 and the output terminals 39, 39 to a utilization device (not shown).

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A transistor signal-translating system operable over a given temperature range comprising: a multiple-unit transistor device effectively including two junction transistors each having an emitter, a base, and a collector and wherein the collector of the first transistor and the emitter of the second transistor share a common semiconductive zone of said device; a first signal-translating circuit including said first transistor, first signal input means connected between the base and emitter of said first transistor for receiving a first signal, and first signal output means connected between the collector and emitter of said first transistor to which said first signal is translated; a second signal-translating circuit including said second transistor, second signal input means connected to the base of said second transistor for receiving a second signal relative to a point of ground reference potential and for maintaining the direct potential of the base substantially at said reference potential, and second signal output means connected between the collector and emitter of said second transistor to which said second signal is translated; biasing means including means connected to the base of said first transistor for applying a direct bias potential thereto relative to said point of reference potential; means including a resistive impedance connected to the emitter of said first transistor for establishing a series direct-current path including said resistive impedance and the emitter and collector of each of said transistors; a capacitive impedance connected to said common zone of said device for maintaining its signal potential at said reference potential; and means for supplying direct potentials relative to said point of reference potential respectively to said resistive impedance and to the collector of said second transistor to establish a direct current through said series path, whereby said resistive impedance serves to stabilize each of said signal-translating circuits against the effects of temperature variations within said range and variations in said direct potentials.

2. A transistor signal-translating system operable over a given temperature range comprising: a semiconductor device having four successive P-N junctions with a first intermediate semiconductor zone joining one side of the first junction with one side of the second junction, a second intermediate semiconductor zone joining one side of the third junction with one side of the fourth junction, and a common semiconductor zone joining the opposite sides of said second and third junctions; a first signal-translating circuit including the first and second of said junctions and said first intermediate semiconductor zone; a second signal-translating circuit including the third and fourth of said junctions and said second intermediate semiconductor zone; signal input means for said first circuit connected between said first intermediate zone and the opposite side of said first junction for receiving a first signal; signal output means for said first circuit connected between said opposite side of said first junction and said common zone to which said first signal is translated; signal input means for said second circuit connected to said second intermediate zone for receiving a second signal relative to a point of ground reference potential and for maintaining the direct potential of that zone substantially at said reference potential; signal output means for said second circuit connected between the opposite side of said fourth junction and said common zone to which said second signal is translated; biasing means including means connected to said first intermediate zone for applying a direct bias potential thereto relative to said point of reference potential; a capacitive impedance connected to said common zone for maintaining its signal potential at said reference potential; means including a resistive impedance connected to said opposite side of said first junction for establishing a series direct-current path comprising said resistive impedance, said first junction, said intermediate zone, said second junction, said common zone, said third junction, said second intermediate zone, and said fourth junction; and means for supplying direct potentials relative to said point of reference potential respectively to said resistive impedance and to the opposite side of said fourth junction to establish a direct current through said series path; whereby said resistive impedance serves to stabilize each of said signal-translating circuits against the effects of temperature variations within said range and variations in said direct potentials.

3. A transistor signal-translating system operable over a given temperature range comprising: a semiconductor device comprising five distinct zones of adjacent alternately opposite type conductivity semiconductive material, the first and second of said zones respectively serving as the emitter and base electrodes of a first semiconductor amplifier, the fourth and fifth of said zones respectively serving as the base and collector electrodes of a second semiconductor amplifier, and the third zone serving integrally as the collector electrode of said first amplifier and as the emitter electrode of said second amplifier; a first signal-translating circuit which includes said first semiconductor amplifier, first signal input means connected between said first and second zones for receiving a first signal; and first signal output means connected between said first and third zones to which said first signal is translated; a second signal-translating circuit which includes said second semiconductor amplifier, second signal input means connected to said fourth zone for receiving a second signal with respect to a point of ground reference potential and for maintaining the direct potential of that zone at said reference potential, and second signal output means connected between said third and fifth zones of said device to which said second signal is translated; biasing means including means connected to said first zone for applying a direct bias potential thereto; a capacitive impedance connected to said third zone for maintaining its signal potential at said ground reference potential; means including a resistive impedance connected to said first zone for establishing a series direct-current path comprising said resistance impedance and all of said zones; and means for supplying direct potentials relative to said point of reference potential respectively to said resistive impedance and to said fifth zone to establish direct current through said series path, whereby said resistive impedance serves to stabilize each of said signal-translating circuits against the effects of temperature variations within said range and variations in said direct potentials.

4. A transistor signal-translating system operable over a given temperature range comprising: a multiple-unit transistor device effectively including two junction transistors each having an emitter, a base, and a collector and wherein the collector of the first transistor and the emitter of the second transistor share a common semiconductive zone of said device; a first signal-translating circuit including said first transistor, first signal input means connected between the base and emitter of said first transistor, and first signal output means connected between the collector and the emitter of said first transistor; a second signal-translating circuit including said second transistor, second signal input means comprising an inductive impedance of small direct-current resistance connected between the base of said second transistor and a point of ground reference potential; and second signal output means connected between the collector and emitter of said second transistor; means for coupling said first signal output means to said second signal input means to cascade said first and second circuits; means for applying an input signal to said first signal input means; a first source of direct potential relative to said point of ground potential; a first resistive impedance for connecting said source to the base of said first transistor to apply a direct bias potential; a capacitor of substantially zero signal impedance connecting said common zone of said device to said point of ground potential; means including a second resistive impedance for connecting said direct potential source to the emitter of said first transistor to establish a series path comprising said second resistive impedance and the emitter and collector of each of said transistors; and means for supplying direct potentials relative to said point of reference potential respectively to said second resistive impedance and to the collector of said second transistor to establish a direct current in said series path, whereby said second resistive impedance serves to stabilize each of said signal-translating circuits against the effects of temperature variations within said range and variations in said direct potentials.

5. A transistor signal-translating system operable over a given temperature range comprising: a multiple-unit transistor device effectively including two junction transistors of the same type conductivity each having an emitter, a base, and a collector and wherein the collector of the first transistor and the emitter of the second transistor share a common semiconductive zone of said device; a first signal-translating circuit including said first transistor, first signal input means connected between the base and emitter of said first transistor for receiving a first signal, and a first signal output means connected between the collector and emitter of said first transistor to which said first signal is translated; a second signal-translating circuit including said second transistor, second signal input means connected to the base of said second transistor for receiving a second signal relative to a point of ground reference potential and for maintaining the direct potential of the base substantially at said reference potential, and second signal output means connected between the collector and emitter of said second transistor to which said second signal is translated; biasing means including means connected to the base of said first transistor for applying a direct bias potential thereto relative to said point of reference potential; means including a resistive impedance connected to the emitter of said first transistor for establishing a series direct-current path including said resistive impedance and the emitter and collector of each of said transistors; a capacitive impedance connected to said common zone of said device for maintaining its signal potential at said reference potential; and means for supplying direct potentials of opposite polarity relative to said point of reference potential respectively to said resistive impedance and to the collector of said second transistor to establish a direct current through said series path, whereby said resistive impedance serves to stabilize each of said signal-translating circuits against the effects of temperature variations within said range and variations in said direct potentials.

6. A transistor signal-translating system operable over a given temperature range comprising: a multiple-unit transistor device effectively including two junction transistors each having an emitter, a base, and a collector and wherein the collector of the first transistor and the emitter of the second transistor share a common semiconductive zone of said device; a first signal-translating circuit including said first transistor, first signal input means connected between the base and emitter of said first transistor for receiving an input signal supplied thereto, and first signal output means connected between the collector and emitter of said first transistor to which said received signal is translated; a second signal-translating circuit including said second transistor, second signal input means coupled to said first output means and connected to the base of said second transistor for applying said translated signal thereto relative to a point of ground reference potential and for maintaining the direct potential of the base substantially at said reference potential, and second signal output means connected between the collector and emitter of said second transistor to which said translated signal is further translated; biasing means including means connected to the base of said first transistor for applying a direct bias potential thereto relative to said point of reference potential; means including a resistive impedance connected to the emitter of said first transistor for establishing a series direct-current path including said resistive impedance and the emitter and collector of each of said transistors; a capacitive impedance connected to said common zone of said device for maintaining is signal potential at said reference potential; and means for supplying direct potentials relative to said point of reference potential respectively to said resistive impedance and to the collector of said second transistor to establish a direct current through said series path; whereby said resistive impedance serves to stabilize each of said signal-translating circuits against the effects of temperature variations within said range and variations in said direct potentials.

7. A transistor signal-translating system operable over a given temperature range comprising: a semiconductor device having four successive P-N junctions with a first intermediate semiconductor zone joining one side of the first junction with one side of the second junction, a second intermediate semiconductor zone joining one side of the third junction with one side of the fourth junction, and a common semiconductor zone joining the opposite sides of said second and third junctions; a first signal-translating circuit including the first and second of said junctions and said first intermediate semiconductor zone; a second signal-translating circuit including the third and fourth of said junctions and said second intermediate semiconductor zone; signal input means for said first circuit connected between said first intermediate zone and the opposite side of said first junction for applying a received signal thereto; signal output means for said first circuit connected between said opposite sides of said first junction and said common zone to which said received signal is translated; signal input means for said second circuit coupled to the signal output means of said first circuit and connected to said second intermediate zone for applying said translated signal thereto relative to a point of ground reference potential and for maintaining the direct potential of that zone substantially at said reference potential; signal output means for said second circuit connected between the opposite side of said fourth junction and said common zone to which said translated signal is further translated; biasing means including means connected to said first intermediate zone for applying a direct bias potential thereto relative to said point of reference potential; a capacitive impedance connected to said common zone for maintaining its signal potential at said reference potential; means including a resistive impedance connected to said opposite side of said first junction for establishing a series direct-current path comprising said resistive impedance, said first junction, said intermediate zone, said second junction, said common zone, said third junction, said second intermediate zone, and said fourth junction; and means for supplying direct potentials of opposite polarities relative to said point of reference potential respectively to said resistive impedance and to the opposite side of said fourth junction to establish a direct current through said series path; whereby said resistive impedance serves to stabilize each of said signal-translating circuits against the effects of temperature variations within said range and variations in said direct potentials.

References Cited in the file of this patent

UNITED STATES PATENTS

| | | |
|---|---|---|
| Re. 23,563 | Barney | Oct. 14, 1952 |
| 2,659,773 | Barney | Nov. 17, 1953 |
| 2,662,124 | McMillan | Dec. 8, 1953 |
| 2,663,806 | Darlington | Dec. 22, 1953 |
| 2,745,038 | Sziklai | May 8, 1956 |
| 2,784,262 | Crow | Mar. 5, 1957 |
| 2,826,647 | Chow | Mar. 11, 1958 |
| 2,831,968 | Stanley et al. | Apr. 22, 1958 |
| 2,839,620 | Waldhauer | June 17, 1958 |

OTHER REFERENCES

Shea: "Principles of Transistor Circuits," Sept. 15, 1953, pp. 108–124.

Garner: "Transistor Guitar Amplifier," Radio and Television News, November 1953, pages 74, 75, 192 (page 75 only relied on).